(12) United States Patent
Takei et al.

(10) Patent No.: US 6,444,320 B1
(45) Date of Patent: Sep. 3, 2002

(54) THERMOSETTING ANTI-REFLECTIVE COATINGS FOR FULL-FILL DUAL DAMASCENE PROCESS

(75) Inventors: Satoshi Takei; Yasuhisa Sone, both of Funabashi; Ken-Ichi Mizusawa, Narashino, all of (JP)

(73) Assignee: Brewer Science, Rolla, MO (US)

( * ) Notice: Subject to any disclaimer, the term of this patent is extended or adjusted under 35 U.S.C. 154(b) by 6 days.

(21) Appl. No.: 09/756,537

(22) Filed: Jan. 8, 2001

(51) Int. Cl.[7] .......................... B32B 27/38; C08L 63/00; G03C 1/76
(52) U.S. Cl. ..................... 428/413; 430/271.1; 430/935; 523/436; 525/510; 525/514; 525/523; 525/533
(58) Field of Search ............................... 430/271.1, 935; 428/413; 523/436, 533; 525/514, 523, 533, 510

(56) References Cited
U.S. PATENT DOCUMENTS 5,693,691 A 12/1997 Flaim et al.
5,851,738 A 12/1998 Thackeray et al.
5,919,598 A * 7/1999 Flaim et al. ............. 430/271.1

* cited by examiner

Primary Examiner—Robert Dawson
Assistant Examiner—Michael J. Feely
(74) Attorney, Agent, or Firm—Hovey Williams LLP

(57) ABSTRACT

New polymers and anti-reflective or fill compositions including those polymers are provided. The polymer comprises recurring monomers according to the formula

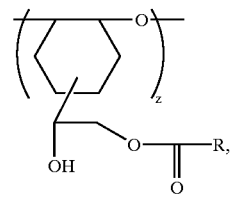

wherein R comprises a light attenuating compound. The inventive compositions can be used to protect contact or via holes from degradation during subsequent etching in the dual damascene process.

53 Claims, 1 Drawing Sheet

THERMOSETTING ANTI-REFLECTIVE COATINGS FOR FULL-FILL DUAL DAMASCENE PROCESS

BACKGROUND OF THE INVENTION

1. Field of the Invention

Figure 1:
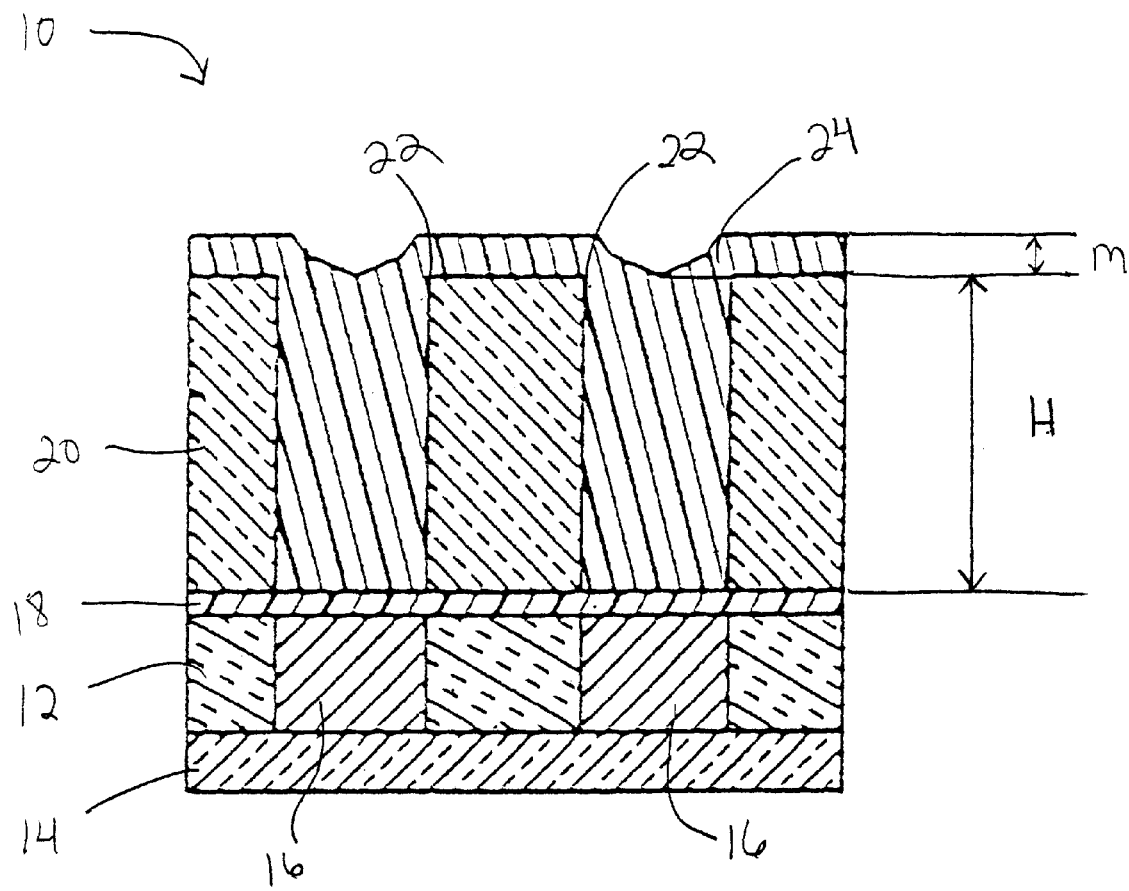

The present invention is concerned with new polymers which can be used to form new anti-reflective or fill compositions for use in the manufacture of microelectronic devices. The polymers comprise an alicyclic moiety, with this moiety preferably forming the backbone of the polymer.

2. Description of the Prior Art

The damascene process, or the process of forming inlaid metal patterning in preformed grooves, is generally a preferred method of fabricating interconnections for integrated circuits. In its simplest form, the dual damascene process starts with an insulating layer which is first formed on a substrate and then planarized. Horizontal trenches and vertical holes (i.e., the contact and via holes) are then etched into the insulating layer corresponding to the required metal line pattern and hole locations, respectively, that will descend down through the insulating layer to the device regions (if through the first insulating layer, i.e., a contact hole) or to the next metal layer down (if through an upper insulating layer in the substrate structure, i.e., a via hole). Metal is next deposited over the substrate thereby filling the trenches and the holes, and thus forming the metal lines and the interconnect holes simultaneously. As a final step, the resulting surface is planarized using the known chemical-mechanical polish (CMP) technique, and readied to accept another dual damascene structure.

During the dual damascene process, the contact and via holes are typically etched to completion prior to the trench etching. Thus, the step of trench etching exposes the bottom and sidewalls (which are formed of the insulating or dielectric layer) of the contact or via holes to over-etch which can deteriorate the contact with the base layer. An organic material is therefore used to partially or completely fill the via or contact holes and to protect the bottom and sidewalls from further etch attack. These organic fill materials can also serve as a bottom anti-reflective coating to reduce or eliminate pattern degradation and linewidth variation in the patterning of the trench layer, provided the fill material covers the surface of the dielectric layer.

Fill materials have been used for the past several years which have high optical density at the typical exposure wavelengths. However, most prior art materials have limited fill properties. For example, when the prior art compositions are applied to the via or contact holes formed within the substrate and to the substrate surface, the films formed by the compositions tend to be quite thin on the substrate surface immediately adjacent the holes, thus leading to undesirable light reflection during subsequent exposure steps. Also, because the prior art compositions etch more slowly than the dielectric layer, the unetched fill compositions provide a wall on which the etch polymer will deposit. This etch polymer build-up then creates undesirable resistance within the metal interconnects of the final circuit.

There is a need in the art for contact or via hole fill materials which provide complete coverage at the top of via and contact holes. Furthermore, this material should provide adequate protection to the base of the via and contact holes during etching to prevent degradation of the barrier layer and damage to the underlying metal conductors.

SUMMARY Of THE INVENTION

The present invention is broadly concerned with new polymers for use in preparing anti-reflective or fill compositions and methods of using those compositions to protect substrates, and particularly contact and via holes formed therein, during circuit manufacturing.

In more detail, the polymers comprise a moiety according to the formula

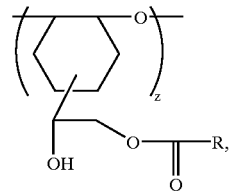

wherein R comprises a light attenuating compound. Preferred light attenuating compounds are those selected from the group consisting of

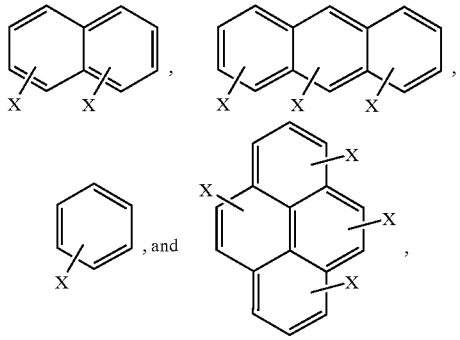

wherein each X is individually selected from the group consisting of hydrogen, $-OR^1$, $-N(R^1)_2$, and $-SR^1$, and each $R^1$ is individually selected from the group consisting of hydrogen and branched and unbranched alkyl groups (preferably $C_1-C_{20}$, and more preferably $C_1-C_{10}$).

Preferably, the polymer further comprises monomers according to the formulas

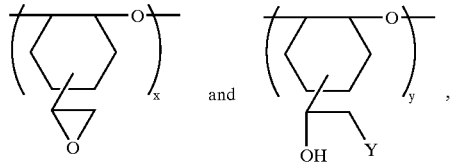

wherein each Y is individually selected from the group consisting of hydrogen, $-OH$, $-CH_3$, $-Cl$, $-Br$, $-CN$, and $-COOR^2$, wherein each $R^2$ is individually selected from the group consisting of hydrogen and branched and unbranched alkyl groups (preferably $C_1-C_{20}$, and more preferably $C_1-C_{10}$). The polymer should comprise less than about 50% by weight, and preferably from about 1–30% by weight of these two monomers.

Even more preferably, the polymer comprises a moiety according to the formula

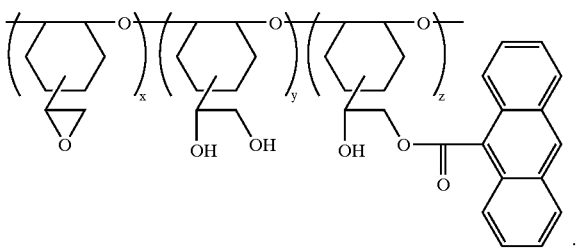

The polymer should comprise at least about 10% by weight, preferably from about 30–95% by weight, and more preferably from about 30–65% by weight of this moiety, based upon the total weight of the polymer taken as 100% by weight.

The weight average molecular weight of the polymer is preferably less than about 100,000 Daltons, more preferably from about 100–30,000 Daltons, and more preferably from about 1,000–5,000 Daltons. The molar ratio of x:y:z should be from about 0:0:0.2 to about 0.8:0.8:1, and more preferably from about 0.01:0.01:0.5 to about 0.5:0.5:1.

Optionally, the above-described monomers can be polymerized with other monomers to alter the properties (e.g., dry etching speed, reflectivity, etc.) of the polymer and of the final anti-reflective or fill composition including the polymer. Examples of such monomers include those set forth in Table 1.

TABLE 1

| Monomer Type | Specific Example |
| --- | --- |
| acrylic acid esters | $C_1$–$C_{10}$ alkyl acrylates |
| methacrylic acid esters | $C_1$–$C_{10}$ alkyl methyacrylates |
| acrylamides | N-alkylacrylamides, N-arylacrylamides, N,N-dialkylacrylamides, N,N-arylacrylamides, N-methyl-N-phenylacrylamide, N-hydroxyethyl-N-methylacrylamide, N-2-acetamideethyl-N-acetylacrylamide |
| methacrylamides | N-akylmethacrylamides, N-arylmethacrylamides, N,N-dialkylmethacrylamides, N,N-diarylmethacrylamides, N-hydroxyethyl-N-methylmethacrylamides, N-methyl-N-phenylmethacrylamides, N-ethyl-N-phenylmethacrylamides |
| vinyl ethers | alkyl vinyl ethers, vinyl aryl ethers |
| vinyl esters | vinyl butyrate, vinyl isobutyrate, vinyl trimethylacetate |
| styrenes | styrene, alkylstyrenes, alkoxystyrenes, halostyrenes, hydroxystyrenes, carboxystyrenes |
| crotonic acid esters | alkyl crotonates (e.g., butyl crotonate, hexyl crotonate, glycerine monocrotonate) |
| allylic compounds | allyl acetates, allyl alcohols, allyl amides |

The inventive polymers can be used to prepare anti-reflective and fill compositions by dissolving the polymer in a suitable solvent system. The solvent system should have a boiling point of from about 60–250° C., and preferably from about 100–200° C. The amount of polymer dissolved in the solvent system is from about 0.1–50% by weight polymer, preferably from about 0.1–20% by weight polymer, and more preferably from about 0.1–20% by weight polymer, based upon the total weight of the composition taken as 100% by weight. The solvent system should be utilized at a level of from about 50–99.9% by weight, preferably from about 80–99.9% by weight, and more preferably from about 90–99.9% by weight, based upon the total weight of the composition taken as 100% by weight.

Preferred solvent systems include a solvent selected from the group consisting of ethylene glycol monomethyl ether, ethylene glycol monoethyl ether, methyl cellulose acetate, ethyl cellulose acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropianate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, and mixtures thereof.

Preferably, the inventive compositions further comprise a crosslinking agent. This can be accomplished by the use of a crosslinking agent separate from the polymer or, alternately, the polymer can include "built-in" crosslinking moieties. Preferred crosslinking agents include those selected from the group consisting of methoxymethyl, methylol, and imino crosslinking agents. The crosslinking agent or moieties should be present in the fill composition at a level of from about 0.1–20% by weight, and preferably from about 0.5–5% by weight, based upon the total weight of all ingredients in the composition taken as 100% by weight. Thus, the fill compositions of the invention should crosslink at a temperature of from about 60–200° C., and more preferably from about 60–150° C.

It will be appreciated that numerous other optional compounds can be incorporated into the inventive anti-reflective or fill compositions if desired. For example, a light attenuating compound separate from the polymer can be utilized in the composition. Furthermore, a flow promoting agent can be incorporated to increase the flowability of the composition. If a flow promoting agent is utilized, it should be present in the composition at a level of from about 0–30% by weight, and preferably from about 0–10% by weight, based upon the total weight of the composition taken as 100% by weight. Examples of suitable flow promoting agents include phthalic acid derivatives (e.g., dimethyl phthalate, butyl isodecyl phthalate, diethyl phthalate, diisobutyl phthalate, dihexyl phthalate), maleic acid derivatives (e.g., di-n-butyl maleate, diethyl maleate, dinonyl maleate), oleic acid derivatives (e.g., methyl oleate, butyl oleate, tetrahydrofurfuryl oleate), and stearic acid derivatives (e.g., n-butyl stearate, glyceryl stearate).

Also, an adhesion promoter can be added to improve the adhesion between the substrate or photoresist layer and a layer of the inventive composition. If an adhesion promoter is utilized, it should be present in the composition at a level of from about 0.1–5% by weight, and preferably from about 0.1–2% by weight, based upon the total weight of the composition taken as 100% by weight. Examples of such agents include chlorosilanes (e.g., trimethylchlorosilane, dimethylvinylchlorosilane, methyldiphenylchlorosilane, chloromethyldimethylchlorosilane), alkoxysilanes (e.g., trimethylmethoxysilane, dimethyldiethoxysilane, methyldimethoxysilane, dimethylvinylethoxysilane, diphenyldimethoxysilane, phenyltriethoxysilane), silazanes (e.g., hexamethyldisilazane, N,N'-bis(trimethylsiline)urea, dimethyltrimethylsilylamine, trimethylsilylimidazole), silanes (e.g., vinyltrichlorosilane, γ-chloropropyltrimethoxysilane, γ-aminopropyltriethoxysilane, γ-glycidoxypropyltrimethoxysilane), heterocyclic compounds (e.g., benzotriazole, benzimidazole, indazole, imidazole, 2-mercaptobenzimidazole, 2-mercaptobenzothiazole, 2-mercaptobenzoxazole, urazolethiouracyl, mercaptoimidazole, mercaptopyrimidine), thioureas, and ureas (e.g., 1,1-dimethylurea, 1,3-dimethylurea).

One or more surfactants may be included in the composition to assist in preventing pinholes or striations. If a surfactant is utilized, it should be present in the composition at a level of from about 0.01–1% by weight, and preferably from about 0.1–0.2% by weight, based upon the total weight of the composition taken as 100% by weight. Suitable surfactants include non-ionic surfactants (e.g., polyoxyethylene alkyl (preferably $C_8$–$C_{20}$) ethers), polyoxyethylene alkyl (preferably $C_8$–$C_{20}$) allyl ethers, sorbitan fatty acid esters, polyoxyethylene sorbitan fatty acid esters, and fluorinated surfactants.

The method of applying the fill compositions to a substrate having a contact or via hole simply comprises applying a quantity of a composition hereof to the substrate surfaces forming the hole by any conventional application method (including spincoating). After the composition is applied to the hole, it is preferably heated to its reflow temperature (e.g., from about 60–120° C.) during a first stage bake process so as to cause the composition to flow into the contact or via hole(s), thus achieving the desired hole and substrate surface coverage. After the desired coverage is achieved, the resulting fill composition layer should then be heated to at least about the crosslinking temperature of the composition so as to cure the layer.

The degree of leveling (as defined herein) of the cured material in the contact or via holes should be at least about 90%, preferably at least about 92%, and more preferably at least about 95%. The thickness of the cured fill material layer on the surface of the substrate adjacent the edge of the contact or via hole should be at least about 50%, preferably at least about 55%, and more preferably at least about 65% of the thickness of the film on the substrate surface a distance away from the edge of the contact or via hole approximately equal to the diameter of the hole. Finally, the percent of solids in the compositions should be formulated so that the thickness of the film formed on the substrate surface is from about 220–240 nm. Following the methods of the invention will yield precursor structures for the dual damascene process having the foregoing desirable properties.

DETAILED DESCRIPTION OF THE PREFERRED EMBODIMENTS

EXAMPLES

The following examples set forth preferred methods in accordance with the invention. It is to be understood, however, that these examples are provided by way of illustration and nothing therein should be taken as a limitation upon the overall scope of the invention.

Example 1

An alicyclic solid epoxy resin (40 g, available under the trade name EHPE from Daicel Chemical Industries, Ltd.) having a weight average molecular weight of 2100 was dissolved in 116 g of propylene glycol monomethyl ether. The alicyclic epoxy resin comprised monomers of the structure depicted in Formula I.

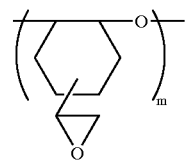

Formula I

After dissolution, 44 g of distilled water and 4 g of benzyltriethylammonium chloride were added, and the mixture was reacted at 90° C. for 20 hours. The reaction product was recovered as a powder by reprecipitation in 500 mL of distilled water. The obtained polymer was subjected to GPC analysis, and its weight average molecular weight in terms of polystyrene was determined to be 2200. The obtained polymer comprised recurring monomers of the two structures shown in Formula II.

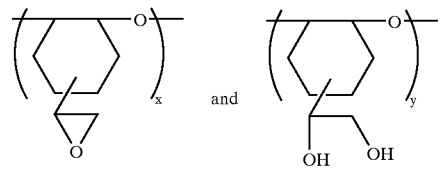

Formula II

The total molar ratio of x:y in the polymer was 78:22.

Example 2

In this procedure, 37 g of the reaction product obtained in Example 1 was dissolved in 138 g of propylene glycol monomethyl ether, and then 26 g of 9-anthracenecarboxylic and 1 g of benzyltriethylammonium chloride were added thereto. The resulting mixture was reacted at 110° C. for 10 hours, and GPC analysis of the obtained polymer in terms of standard polystyrene was 2400. The polymer comprised monomers having the structure shown in Formula III.

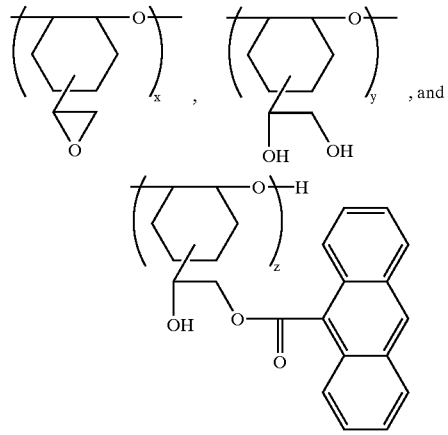

Formula III

The molar ratio of x:y:z in the total polymer was 18:22:60.

Example 3

Cresol novolak resin (10 g, available from Asahi Chiba Company, Ltd., under the trade name ECN1299) having a weight average molecular weight of 3900 was dissolved in 80 g of propylene glycol monomethyl ether. The novolak resin comprised monomers of the structure depicted in Formula IV.

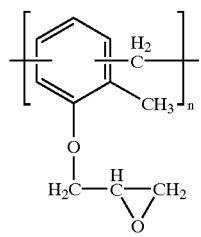

Formula IV

After dissolution, 9.7 g of 9-anthracenecarboxylic acid and 0.26 g of benzyltriethylammonium chloride were added, and the mixture was reacted at 105° C. for 24 hours. The reaction product was subjected to GPC analysis, and its weight average molecular weight in terms of polystyrene was determined to be 5600. The obtained polymer comprised recurring monomers of the structure shown in Formula V.

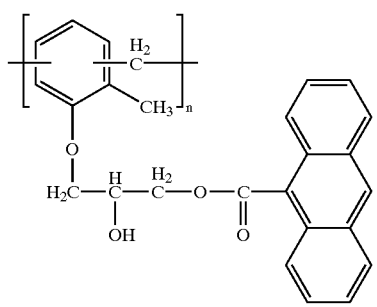

Formula V

Example 4

Methacrylic acid glycidyl ester monomers (26 g, obtained from Junsei Kagaku Company, Ltd.) and 57 g of hydroxypropyl methacrylate (obtained from Junsei Kagaku Company, Ltd.) were dissolved in 331 g of propylene glycol monomethyl ether. The mixture was allowed to react for 30 minutes under nitrogen flow. Next, the reaction mixture was maintained at 70° C. while 0.8 g of azobisisobutyronitrile (AIBN, obtained from Junsei Kagaku Company, Ltd.) as a polymerization initiator and 0.3 g of 1-dodecanethiol (obtained from Kanto Kagaku Company, Ltd.) as a chain transfer agent were added, and the mixture was stirred under nitrogen. After 24 hours of stirring, 0.1 g of 4-methoxyphenol (obtained from Tokyo Kasei Company, Ltd.) as a polymerization terminator was added. GPC analysis of the obtained polymer indicated a weight average molecular weight in terms of polystyrene of 36,400. The solids content in the solution was 20%.

The resulting polymer comprised monomers of the structure shown in Formula VI, with the molar ratio of x:y being 35:65.

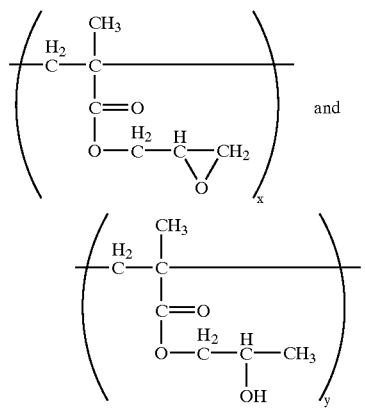

Formula VI

Example 5

In this procedure, 6.8 g of 9-anthracenecarboxylic acid and 0.19 g of benzyltriethylammonium chloride were added to 12.8 g of the polymer prepared in Example 4, and the resulting mixture was reacted at 105° C. for 24 hours. GPC analysis of the obtained polymer indicated a weight average molecular weight in terms of polystyrene of 53,000. The resulting polymer comprised monomers of the structure shown in Formula VII (where x=35 and y=65).

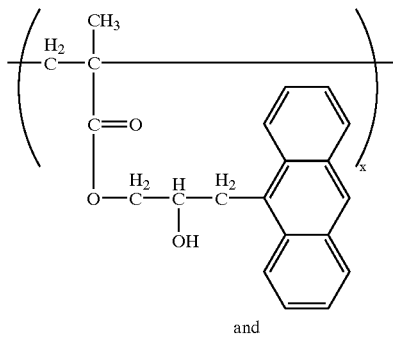

Formula VII

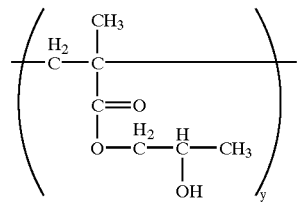

Example 6

A 30% polymer solids solution containing 3 g of the polymer obtained in Example 2 (see Formula III) above in PGME was prepared. Next, 9 g of the solution was mixed with 0.4 g of hexamethoxymethylolmelamine as a crosslinking agent and 0.4 g of p-toluenesulfonic acid as a hardening agent. The resulting mixture was dissolved in 26 g of ethyl lactate, 13 g of propylene glycol monomethyl ether, and 8 g of cyclohexanone as solvents to form a 7% solution. This solution was then filtered through microfilters made of polyethylene and having a pore diameter of 0.10 μm, followed by further filtering through polyethylene microfilters having a pore diameter of 0.05 μm to prepare an anti-reflective coating composition.

The composition was then spin-coated on a silicon wafer, and the wafer was heated at 205° C. for 1 minute on a hotplate to form an anti-reflective coating having a film thickness of 0.25 μm. Measurements of the anti-reflective coating by a spectral ellipsometer indicated a refractive index n of 1.5 and an optical extension coefficient k of 0.48 at 248 nm.

Example 7

Comparative Example

A 20% polymer solids solution containing 2 g of the polymer obtained in Example 3 (see Formula V) above in PGME was prepared. Next, 10 g of the solution was mixed with 0.26 g of tetramethoxymethyl glycoluryl as a crosslinking agent and 0.04 g of pyridinium p-toluenesulfonate as a hardening agent. The resulting mixture was dissolved in 12.8 g of ethyl lactate, 0.13 g of propylene glycol monomethyl ether, and 2.3 g of cyclohexanone as solvents to form a 9% solution. This solution was then filtered through microfilters made of polyethylene and having a pore diameter of 0.10 μm, followed by further filtering through polyethylene microfilters having a pore diameter of 0.05 μm to prepare an anti-reflective coating composition.

The composition was then spin-coated on a silicon wafer, and the wafer was heated at 205° C. for 1 minute on a hotplate to form an anti-reflective coating having a film thickness of 0.25 μm. Measurements of the anti-reflective coating by a spectral ellipsometer indicated a refractive index n of 1.55 and an optical extension coefficient k of 0.60 at 248 nm.

Example 8

Comparative Example

A 20% polymer solids solution containing 10 g of the polymer obtained in Example 3 (see Formula V) above in PGME was prepared. Next, 10 g of the solution was mixed with 0.53 g of hexamethoxymethylolmelamine as a crosslinking agent and 0.05 g of p-toluenesulfonic acid as a hardening agent. The resulting mixture was dissolved in 14.3 g of ethyl lactate, 1.13 g of propylene glycol monomethyl ether, and 2.61 g of cyclohexanone as solvents to form a 9% solution. This solution was then filtered through microfilters made of polyethylene and having a pore diameter of 0.10 μm, followed by further filtering through polyethylene microfilters having a pore diameter of 0.05 μm to prepare an anti-reflective coating composition.

The composition was spin-coated on a silicon wafer, and the wafer was heated at 205° C. for 1 minute on a hotplate to form an anti-reflective coating having a film thickness of 0.25 μm. Measurements of the anti-reflective coating by a spectral ellipsometer indicated a refractive index n of 1.58 and an optical extension coefficient k of 0.58 at 248 nm.

Example 9

Comparative Example

A 20% polymer solids solution containing 2 g of the polymer obtained in Example 5 (see Formula VII) above in PGME was prepared. Next, 10 g of the solution was mixed with 0.48 g of tetramethoxymethyl glycoluryl as a crosslinking agent and 0.01 g of p-toluenesulfonic acid as a hardening agent. The resulting mixture was dissolved in 9.24 g of propylene glycol monomethyl ether acetate and 13.55 g of propylene glycol monomethyl ether as solvents to form a 7.5% solution. This solution was then filtered through microfilters made of polyethylene and having a pore diameter of 0.10 μm, followed by further filtering through polyethylene microfilters having a pore diameter of 0.05 μm to prepare an anti-reflective coating composition.

The composition was then spin-coated on a silicon wafer, and the wafer was heated at 205° C. for 1 minute on a hotplate to form an anti-reflective coating having a film thickness of 0.25 μm. Measurements of the anti-reflective coating by a spectral ellipsometer indicated a refractive index n of 1.48 and an optical extension coefficient k of 0.47 at 248 nm.

Example 10

Comparative Example

A 20% polymer solids solution containing 2 g of the polymer obtained in Example 5 (see Formula VII) above in PGME was prepared. Next, 10 g of the solution was mixed with 0.26 g of hexamethoxymethylolmelamine as a crosslinking agent and 0.01 g of p-toluenesulfonic acid as a hardening agent. The resulting mixture was dissolved in 8.41 g of propylene glycol monomethyl ether acetate and 11.62 g of propylene glycol monomethyl ether as solvents to form a 7.5% solution. This solution was then filtered through microfilters made of polyethylene and having a pore diameter of 0.10 μm, followed by further filtering through polyethylene microfilters having a pore diameter of 0.05 μm to prepare an anti-reflective coating composition.

The composition was then spin-coated on a silicon wafer, and the wafer was heated at 205° C. for 1 minute on a hotplate to form an anti-reflective coating having a film thickness of 0.25 μm. Measurements of the anti-reflective coating by a spectral ellipsometer indicated a refractive index n of 1.50 and an optical extension coefficient k of 0.48 at 248 nm.

Example 11

The solutions prepared in Examples 6–10 were spin-coated onto respective silicon wafers. The coated wafers were then heated on a hotplate for one minute at 205° C. to form an anti-reflective coating have a film thickness of 0.22 μm. The samples were dipped into a photoresist solvent (either ethyl lactate or propylene glycol monomethyl ether) to test resistance to the solvents. Each of the coatings was insoluble in the solvent.

Example 12

The solutions prepared in Examples 6–10 were spin-coated onto respective silicon wafers. The coated wafers were heated on a hotplate for one minute at 205° C. to form an anti-reflective coating. The respective thicknesses of each anti-reflective coating was measured and recorded. Each of the anti-reflective coatings was spin-coated with a photoresist solution (APEX-E, obtained from Shipley Company). The coated wafers were then heated on a hotplate for one minute at 90° C. The resulting photoresist layer was exposed to light having a wavelength of 248 nm after which the exposed photoresist was baked at 90° C. for 1.5 minutes. The photoresist layers were then developed, and the film thicknesses of the anti-reflective coatings were again measured and recorded. This confirmed that no intermixing occurred between the anti-reflective coatings and the photoresist layer.

Example 13

The solutions prepared in Examples 6–10 were spin-coated onto respective silicon wafers having holes (diameter: 0.25 μm; depth: 0.9 μm) formed therein. The silicon wafer had both Iso and Dense patterns of holes. An Iso pattern is a pattern in which the distance between the center of a first hole and the center of an adjacent hole is at least three times the diameter of the first hole. A Dense pattern is a pattern in which the distance between the center of a first hole and the center of an adjacent hole is equal to or less than the diameter of the first hole.

The coated wafers were then heated on a hotplate for one minute at 205° C. to form an anti-reflective coating have a film thickness of 0.25 μm. The degree of leveling of the anti-reflective coating was determined by observing (under a scanning electron microscope) the cross-sectional surface of the silicon wafer substrate. The degree of leveling was calculated. This can be better understood by referring to FIG. 1. A starting damascene structure 10 includes a dielectric material 12 applied to a substrate 14 and interspersed with a pattern of gate or metal conductors 16. A protective barrier layer 18 preferably covers and thus protects dielectric material 12 and conductor 16 during further etching. A dielectric material 20 is applied immediately adjacent barrier layer 18, and a photoresist (not shown) is applied to the dielectric material 20 followed by exposure and developing of the resist contact or via hole patterns onto the dielectric material 20 and subsequent etching to form the contact or via holes 22. A fill material 24 is applied to holes 22 to fill the holes, after which the material 24 is cured.

Thus, the degree of leveling was determined as follows (where 100% means that complete leveling was achieved):

$$\text{Degree of leveling} = \left( \frac{1 - (\text{height of meniscus ``M''})}{\text{height ``H'' of the hole}} \right) \times 100,$$

wherein "M" and "H" are as shown in FIG. 1.

The degree of leveling for each of these layers is reported in Table 2. The degree of leveling of the inventive anti-reflective coating of Example 6 was higher than the prior art anti-reflective coatings of Examples 7–10. The anti-reflective coating of Example 6 had a particularly impressive degree of leveling in the dense pattern which is a highly problematic pattern. It was also noted that the difference in the film thicknesses between the Iso patterns and the Dense patterns (i.e., the Bias) was small. This is due to the fact that the inventive anti-reflective coating composition is highly and smoothly flowable, thus allowing a large number of holes to be filled smoothly, resulting in a substantially constant film thickness.

TABLE 2

| | Film Thickness (nm) | | | Degree of Leveling (%) | | |
|---|---|---|---|---|---|---|
| | Iso | Dense | Bias | Iso | Dense | Bias |
| Example 6 | 210 | 120 | 90 | 98 | 97 | 1 |
| Example 7 | 190 | 70 | 120 | 96 | 91 | 5 |
| Example 8 | 200 | 80 | 120 | 96 | 86 | 10 |
| Example 9 | 230 | 110 | 120 | 93 | 71 | 22 |
| Example 10 | 220 | 80 | 160 | 98 | 90 | 8 |

We claim:

1. A polymer comprising recurring monomers according to the formula

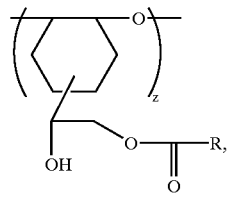

wherein R comprises a light attenuating compound.

2. A polymer of claim 1, wherein R is according to a formula selected from the group consisting of

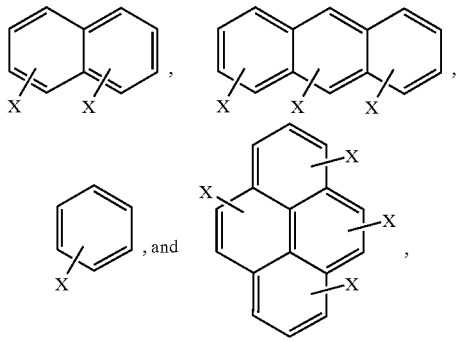

wherein each X is individually selected from the group consisting of hydrogen, $-OR^1$, $-N(R^1)_2$, and $-SR^1$, and each $R^1$ is individually selected from the group consisting of hydrogen and branched and unbranched alkyl groups.

3. The polymer of claim 2, wherein R is according to the formula

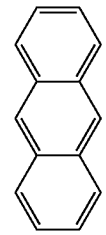

4. The polymer of claim 1, said polymer further comprising monomers according to the formulas

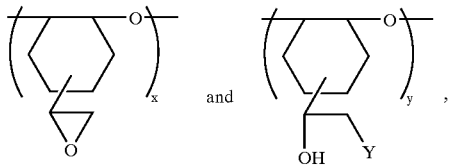

wherein each Y is individually selected from the group consisting of hydrogen, $-OH$, $-CH_3$, $-Cl$, $-Br$, $-CN$, and $-COOR^2$, and each $R^2$ is individually selected from the group consisting of hydrogen and branched and unbranched alkyl groups.

5. The polymer of claim 4, wherein said polymer comprises a moiety according to the formula

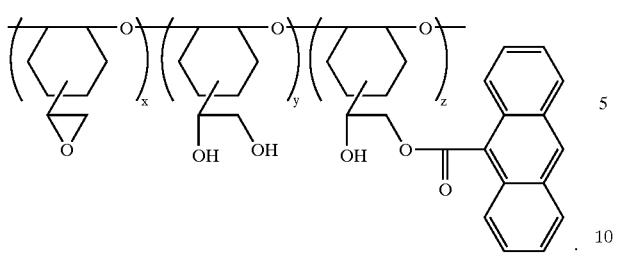

6. The polymer of claim 5, wherein said polymer comprises at least about 10% by weight of said moiety, said percentage by weight being based upon the total weight of the polymer taken as 100% by weight.

7. The polymer of claim 4, wherein the molar ratio of x:y:z is from about 0:0:0.2 to about 0.8:0.8:1.

8. The polymer of claim 4, wherein said polymer comprises a moiety having the formula

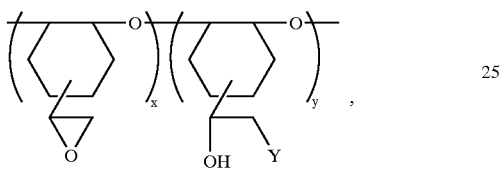

said polymer comprising less than about 50% by weight of the moiety, said percentage by weight being based upon the total weight of the polymer taken as 100% by weight, wherein each Y is individually selected from the group consisting of hydrogen, —OH, —CH$_3$, —Cl, —Br, —CN, and —COOR$^2$, and each R$^2$ is individually selected from the group consisting of hydrogen and branched and unbranched alkyl groups.

9. The polymer of claim 1, wherein said polymer has a weight average molecular weight of less than about 100,000 Daltons.

10. In an anti-reflective or fill composition for protecting a base material or holes formed in a base material, the composition including a polymer dissolved in a solvent system, the improvement which comprises said polymer comprising recurring monomers of the formula

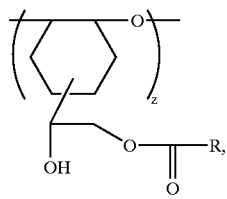

wherein R comprises a light attenuating compound.

11. The composition of claim 10, wherein R is according to a formula selected from the group consisting of

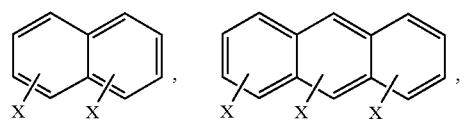

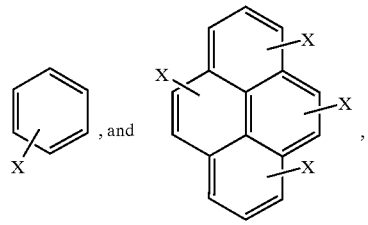

wherein each X is individually selected from the group consisting of hydrogen, —OR$^1$, —N(R$^1$)$_2$, and —SR$^1$, and each R$^1$ is individually selected from the group consisting of hydrogen and branched and unbranched alkyl groups.

12. The composition of claim 11, wherein R is according to the formula

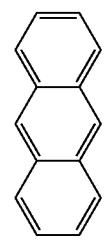

13. The composition of claim 10, said polymer further comprising monomers according to the formulas

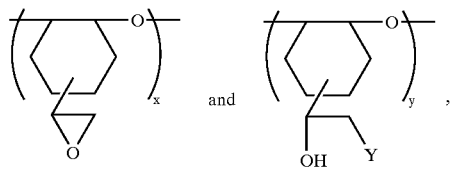

wherein each Y is individually selected from the group consisting of hydrogen, —OH, —CH$_3$, —Cl, —Br, —CN, and —COOR$^2$, and each R$^2$ is individually selected from the group consisting of hydrogen and branched and unbranched alkyl groups.

14. The composition of claim 13, wherein said polymer comprises a moiety according to the formula

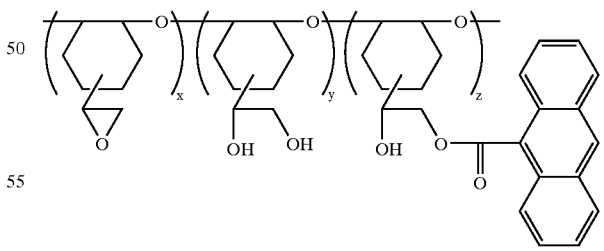

15. The composition of claim 13, wherein the molar ratio of x:y:z is from about 0:0:0.2 to about 0.8:0.8:1.

16. The composition of claim 13, wherein said polymer comprises at least about 10% by weight of said moiety, said percentage by weight being based upon the total weight of the polymer taken as 100% by weight.

17. The composition of claim 13, wherein said polymer comprises a moiety having the formula

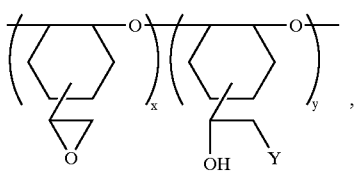

said polymer comprising less than about 50% by weight of the moiety, said percentage by weight being based upon the total weight of the polymer taken as 100% by weight, wherein each Y is individually selected from the group consisting of hydrogen, —OH, —CH$_3$, —Cl, —Br, —CN, and —COOR$^2$, and each R$^2$ is individually selected from the group consisting of hydrogen and branched and unbranched alkyl groups.

18. The composition of claim 10, wherein said polymer has a weight average molecular weight of less than about 100,000 Daltons.

19. The composition of claim 10, wherein said solvent system includes a solvent selected from the group consisting of ethylene glycol monomethyl ether, ethylene glycol monoethyl ether, methyl cellulose acetate, ethyl cellulose acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropianate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, and mixtures thereof.

20. The composition of claim 10, wherein said solvent system has a boiling point of from about 60–250° C.

21. The composition of claim 10, said composition further comprising a crosslinking agent.

22. The composition of claim 21, wherein said crosslinking agent is selected from the group consisting of methoxymethyl, methylol, and imino crosslinking agents.

23. The composition of claim 10, said polymer further comprising recurring monomers selected from the group consisting of acrylic acid esters, acrylamides, methacrylic acid esters, methacrylamides, allylic compounds, vinyl ethers, vinyl esters, styrenes, crotonic acid esters, and mixtures thereof.

24. The composition of claim 10, said composition further comprising a compound selected from the group consisting of surfactants, adhesion promoters, light attenuating agents, flow promoting agents, and mixtures thereof.

25. A method of applying a fill composition to a contact or via hole having a bottom and sidewalls and formed in a substrate, said composition being useful for protecting the substrate during etching processes, said method comprising the steps of:
  providing a quantity of a fill composition in accordance with claim 10; and
  applying said composition to at least a portion of said bottom and sidewalls.

26. The method of claim 25, wherein said composition is capable of being crosslinked at a crosslinking temperature, and further including the step of heating said composition to its reflow temperature so as to cause at least some of the composition to flow into the contact or via hole, said reflow temperature being less than the crosslinking temperature of the composition.

27. The method of claim 26, further including the step of curing said composition by heating the composition to at least about its crosslinking temperature after said reflow heating step.

28. The method of claim 27, wherein the degree of leveling of said composition in said hole after said curing step is at least about 90%.

29. The method of claim 25, wherein R is according to a formula selected from the group consisting of

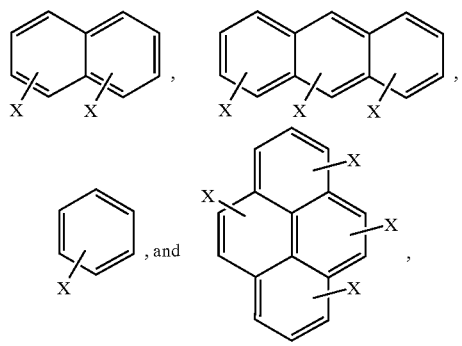

wherein each X is individually selected from the group consisting of hydrogen, —OR$^1$, —N(R$^1$)$_2$, and —SR$^1$, and each R$^1$ is individually selected from the group consisting of hydrogen and branched and unbranched alkyl groups.

30. The method of claim 29, wherein R is according to the formula

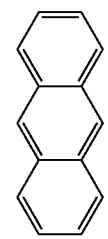

31. The method of claim 25, said polymer further comprising monomers according to the formulas

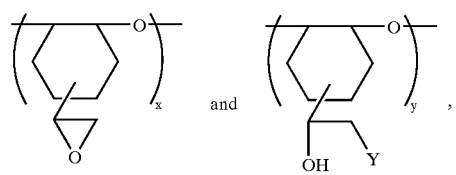

wherein each Y is individually selected from the group consisting of hydrogen, —OH, —CH$_3$, —Cl, —Br, —CN, and —COOR$^2$, and each R$^2$ is individually selected from the group consisting of hydrogen and branched and unbranched alkyl groups.

32. The method of claim 31, wherein the molar ratio of x:y:z is from about 0:0:0.2 to about 0.8:0.8:1.

33. The method of claim 31, wherein said polymer comprises a moiety having the formula

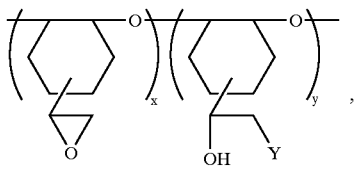

said polymer comprising less than about 50% by weight of the moiety, said percentage by weight being based upon the total weight of the polymer taken as 100% by weight, wherein each Y is individually selected from the group consisting of hydrogen, —OH, —CH$_3$, —Cl, —Br, —CN, and —COOR$^2$, and each R$^2$ is individually selected from the group consisting of hydrogen and branched and unbranched alkyl groups.

34. The method of claim 25, wherein said polymer has a weight average molecular weight of less than about 100,000 Daltons.

35. The method of claim 25, wherein said polymer comprises a moiety according to the formula

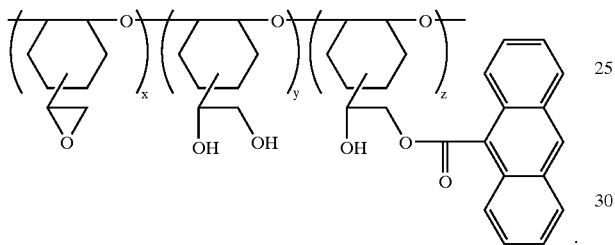

36. The method of claim 35, wherein said polymer comprises at least about 10% by weight of said moiety, said percentage by weight being based upon the total weight of the polymer taken as 100% by weight.

37. The method of claim 25, wherein said solvent system includes a solvent selected from the group consisting of ethylene glycol monomethyl ether, ethylene glycol monoethyl ether, methyl cellulose acetate, ethyl cellulose acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropianate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, and mixtures thereof.

38. The method of claim 25, wherein said solvent system has a boiling point of from about 60–250° C.

39. The method of claim 25, said composition further comprising a crosslinking agent.

40. The method of claim 39, wherein said crosslinking agent is selected from the group consisting of methoxymethyl, methylol, and imino crosslinking agents.

41. The method of claim 25, said polymer further comprising recurring monomers selected from the group consisting of acrylic acid esters, acrylamides, methacrylic acid esters, methacrylamides, allylic compounds, vinyl ethers, vinyl esters, styrenes, crotonic acid esters, and mixtures thereof.

42. The method of claim 25, said composition further comprising a compound selected from the group consisting of surfactants, adhesion promoters, light attenuating agents, flow promoting agents, and mixtures thereof.

43. The combination of a substrate having a surface and a cured protective layer on said substrate surface, said cured protective layer being formed from a composition comprising a polymer comprising recurring monomers of the formula

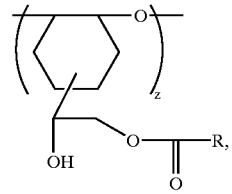

wherein R comprises a light attenuating compound.

44. The combination of claim 43, wherein R is according to a formula selected from the group consisting of

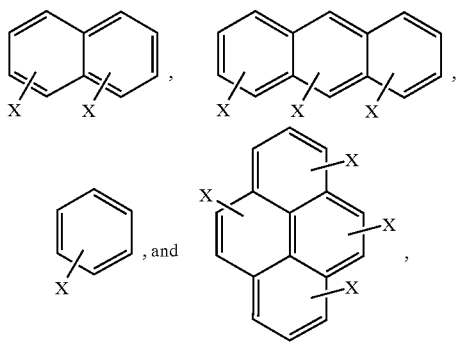

wherein each X is individually selected from the group consisting of hydrogen, —OR$^1$, —N(R$^1$)$_2$, and —SR$^1$, and each R$^1$ is individually selected from the group consisting of hydrogen and branched and unbranched alkyl groups.

45. The combination of claim 44, wherein R is according to the formula

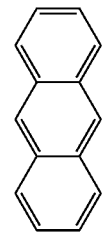

46. The combination of claim 43, said polymer further comprising monomers according to the formulas

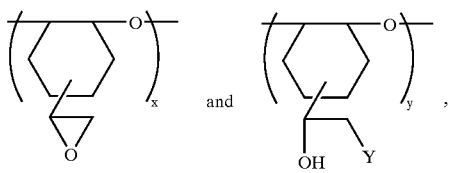

wherein each Y is individually selected from the group consisting of hydrogen, —OH, —CH$_3$, —Cl, —Br, —CN, and —COOR$^2$, and each R$^2$ is individually selected from the group consisting of hydrogen and branched and unbranched alkyl groups.

47. The combination of claim 46, wherein said polymer comprises a moiety according to the formula

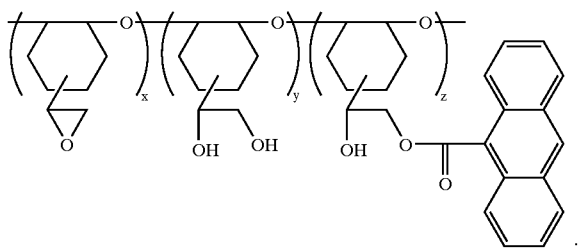

48. The combination of claim 47, wherein the molar ratio of x:y:z is from about 0:0:0.2 to about 0.8:0.8:1.

49. The combination of claim 46, wherein said polymer comprises at least about 10% by weight of said moiety, said percentage by weight being based upon the total weight of the polymer taken as 100% by weight.

50. The combination of claim 46, wherein said polymer comprises a moiety having the formula

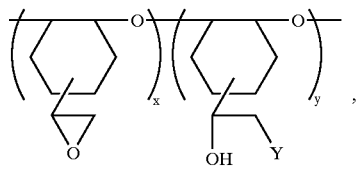

said polymer comprising less than about 50% by weight of the moiety, said percentage by weight being based upon the total weight of the polymer taken as 100% by weight, wherein each Y is individually selected from the group consisting of hydrogen, —OH, —CH$_3$, —Cl, —Br, —CN, and —COOR$^2$, and each R$^2$ is individually selected from the group consisting of hydrogen and branched and unbranched alkyl groups.

51. The combination of claim 43, wherein said polymer has a weight average molecular weight of less than about 100,000 Daltons.

52. The combination of claim 43, wherein said substrate has a hole formed therein, said hole being defined by a bottom wall and sidewalls, and said cured protective layer being in contact with at least a portion of the surfaces of said bottom wall and sidewalls.

53. The combination of claim 52, wherein the degree of leveling of said cured protective layer in said hole is at least about 90%.

* * * * *